(12) United States Patent
Mårtensson et al.

(10) Patent No.: US 8,283,058 B2
(45) Date of Patent: Oct. 9, 2012

(54) FINE GRAINED CEMENTED CARBIDE CUTTING TOOL INSERT

(75) Inventors: Malin Mårtensson, Nacka (SE); Kerstin Lundin, Stockholm (SE); Susanne Norgren, Huddinge (SE)

(73) Assignee: Sandvik Intellectual Property AB, Sandviken (SE)

( * ) Notice: Subject to any disclaimer, the term of this patent is extended or adjusted under 35 U.S.C. 154(b) by 440 days.

(21) Appl. No.: 12/126,121

(22) Filed: May 23, 2008

(65) Prior Publication Data
US 2008/0299383 A1    Dec. 4, 2008

(30) Foreign Application Priority Data

| | | |
|---|---|---|
| Jun. 1, 2007 | (SE) | 0701320 |
| Jun. 15, 2007 | (SE) | 0701449 |
| Jun. 27, 2007 | (SE) | 0701548 |
| Jul. 23, 2007 | (SE) | 0701761 |

(51) Int. Cl.
*B32B 9/00* (2006.01)
*C23C 14/06* (2006.01)

(52) U.S. Cl. ............ 428/697; 51/307; 51/309; 428/216; 428/336; 428/472; 428/698; 428/699; 407/119; 204/192.15; 204/192.16; 204/192.38

(58) Field of Classification Search ............ 51/307, 51/309; 428/216, 336, 469, 698, 699, 472, 428/697; 75/240; 407/119; 204/192.15, 204/192.16, 192.38
See application file for complete search history.

(56) References Cited

U.S. PATENT DOCUMENTS

| | | | | |
|---|---|---|---|---|
| 5,679,448 A | * | 10/1997 | Kawata | 428/697 |
| 5,761,593 A | | 6/1998 | Ostlund et al. | 419/29 |
| 6,103,357 A | * | 8/2000 | Selinder et al. | 51/307 |

(Continued)

FOREIGN PATENT DOCUMENTS

DE    101 35 790 B4    7/2005

(Continued)

OTHER PUBLICATIONS

Hsieh et al "Deposition and characterization of TiAlN and multilayered TiN/TiAlN coatings using unbalanced magetron sputtering" Surface & Coaitngs Technology 108-109 (1998) p. 132-137.*

(Continued)

*Primary Examiner* — Archene Turner
(74) *Attorney, Agent, or Firm* — Morgan, Lewis & Bockius LLP

(57) ABSTRACT

The present invention relates to a cuffing insert for turning in heat resistant superalloys and stainless steels comprising a very fine grained hard substrate and a coating. The substrate comprises WC from about 5 to about 8 wt % Co and from about 0.3 to about 1.5 wt % Cr. In addition to that ppm levels of Ti and Ta are present. The ratio of Me/Co=(at-% Ti+ at-% Nb+ at-% Ta)/at-% Co is lower than or equal to about 0.014–(CW_Cr)*0.008 and higher than about 0.0005. The average sintered WC-grain size is from about 0.5 to about 0.95 µm and CW_Cr from about 0.75 to about 0.95. The cemented carbide body is coated with a PVD $Ti_xAl_{1-x}N$-coating with an average composition of x being greater than about 0.4 but less than about 0.9, present as a single or multilayer coating with a total thickness of from about 1 to about 6 µm.

24 Claims, 2 Drawing Sheets

U.S. PATENT DOCUMENTS

| | | | |
|---|---|---|---|
| 6,214,287 B1 | 4/2001 | Waldenstrom | |
| 6,250,855 B1* | 6/2001 | Persson et al. | 51/309 |
| 6,261,673 B1 | 7/2001 | Reineck et al. | |
| 6,273,930 B1* | 8/2001 | Waldenstrom | 75/240 |
| 6,309,738 B1* | 10/2001 | Sakurai | 428/216 |
| 6,342,291 B1 | 1/2002 | Jonsson et al. | |
| 6,413,293 B1* | 7/2002 | Grearson et al. | 75/240 |
| 6,575,671 B1 | 6/2003 | North et al. | 407/119 |
| 6,884,499 B2* | 4/2005 | Penich et al. | 428/699 |
| 7,179,319 B2 | 2/2007 | Heinrich et al. | 75/236 |
| 7,727,621 B2* | 6/2010 | Nordlof et al. | 428/216 |
| 2002/0051887 A1 | 5/2002 | Jonsson et al. | |
| 2005/0072269 A1 | 4/2005 | Banerjee | |
| 2006/0029511 A1 | 2/2006 | Gustafson et al. | |
| 2006/0286410 A1* | 12/2006 | Ahlgren et al. | 428/698 |
| 2007/0154739 A1* | 7/2007 | Martensson et al. | 428/698 |
| 2007/0292671 A1 | 12/2007 | Akesson et al. | |
| 2008/0276544 A1 | 11/2008 | Hirose | |

FOREIGN PATENT DOCUMENTS

| | | |
|---|---|---|
| EP | 0 773 080 A1 | 10/1996 |
| EP | 1 038 989 B1 | 9/2000 |
| EP | 1 347 076 B1 | 9/2003 |
| EP | 1 470 879 A1 | 10/2004 |
| EP | 1 526 189 A1 | 4/2005 |
| EP | 1 749 601 A1 | 6/2006 |
| EP | 1 676 939 A1 | 7/2006 |
| EP | 1 043 413 B1 | 9/2006 |
| EP | 1 795 628 A1 | 6/2007 |
| EP | 1 798 308 A2 | 6/2007 |
| EP | 1 798 310 A2 | 6/2007 |
| EP | 1 803 830 A1 | 7/2007 |
| EP | 1 500 713 B1 | 8/2007 |
| EP | 1 900 849 A1 | 3/2008 |
| GB | 1 593 326 | 7/1981 |
| JP | 7-97679 | 4/1995 |
| JP | 10-324942 | 12/1998 |
| JP | 10-324943 | 12/1998 |
| JP | 11-12718 A | 1/1999 |
| JP | 11-152535 | 6/1999 |
| JP | 2000-23320 | 8/2000 |
| JP | 2001-329360 A | 11/2001 |
| JP | 2003193171 (A) | 7/2003 |
| JP | 2004-315904 | 11/2004 |
| JP | 2004315904 A | 11/2004 |
| JP | 2006-117974 | 5/2006 |
| JP | 2006-117974 | 11/2006 |
| JP | 2007-44807 | 2/2007 |
| JP | 2008-1918 | 1/2008 |
| JP | 2009-61579 | 3/2009 |
| JP | 2009-66747 | 4/2009 |
| WO | WO 97/20082 | 6/1997 |
| WO | 99/13120 | 3/1999 |
| WO | 2006/041366 A1 | 4/2006 |
| WO | 2006/043421 A1 | 4/2006 |
| WO | 2006/080888 A1 | 8/2006 |

OTHER PUBLICATIONS

Anderson et al "Depsotion, microstructure and mechanical and tribological properties of magnetron sputtered TiN/TiAlN multilayers" Suface & Coatings Technology 123 (2000) p. 219-226.*

European Search Report dated Nov. 12, 2008 issued in European Application No. 08 156 057.5.

Office Action mailed Aug. 13, 2010, in U.S. Appl. No. 12/128,803.

Office Action mailed Oct. 27, 2010, in U.S. Appl. No. 12/128,803.

Office Action mailed Aug. 13, 2010, in U.S. Appl. No. 12/147,587.

Office Action mailed Aug. 13, 2010, in U.S. Appl. No. 12/126,195.

Office Action mailed Sep. 3, 2010, in U.S. Appl. No. 12/129,963.

European Search Report dated Nov. 13, 2008, issued in EP 08 10 4014.

European Search Report dated Nov. 11, 2008, issued in EP 08 15 6044.

European Search Report dated Nov. 12, 2008, issued in EP 08 15 7076.

International Search Report dated Oct. 3, 2008, issued in PCT/SE2008/050777.

Swedish Office Action mailed Jul. 12, 2007, issued in 0701449-1.

S. Liu, "Magnetic Property of Binder in WC-Co Cemented Carbides", Transactions of NFsoc, vol. 2, No. 3 (Aug. 1992), pp. 83-86.

B. Roebuck, "Magnetic Moment (Saturation) Measurements on Hardmetals", Int. J. of Refractory Metals & Hard Materials 14(1996), 419-424.

Notice of Opposition against EP 2 011 890, dated Jul. 13, 2011.

Notice of Opposition against EP 2006413, dated Jul. 18, 2011.

* cited by examiner

FINE GRAINED CEMENTED CARBIDE CUTTING TOOL INSERT

BACKGROUND OF THE INVENTION

The present invention relates to a coated cutting tool insert particularly useful for turning of heat resistant superalloys (HRSA) and stainless steels under wet conditions. Very hard fine grained substrates in combination with a (Ti,Al)N PVD-coating greatly improves the notch wear resistance with maintained good flank wear resistance, resistance against plastic deformation and secondary edge notch wear resistance.

Superalloys and stainless steels are developed specifically for applications demanding exceptional mechanical and chemical properties at elevated temperatures. Superalloys are used in aircraft engines while stainless steels are used in a broad range of applications. Almost every metallurgical change made to improve the high temperature properties makes it more difficult to machine these alloys. For stainless steels, this is most prominent for austenitic and so called duplex stainless steels.

As high temperature strength is increased, the alloys become harder and stiffer at the cutting temperature. This results in increased cutting forces and increased wear on the cutting edge during machining.

Because stronger materials generate more heat during chip formation and because the thermal heat conductivity of these alloys are relatively low, very high cutting temperatures are generated. This also contributes to an increased wear of the cutting edge.

Turning can generally be divided in roughing, semi-roughing, semi-finishing and finishing. In roughing and semi-roughing, the depth of cut is generally larger than the nose radius and in HRSA and stainless steels, notch wear on the leading edge and secondary edge are often the critical wear mechanisms together with plastic deformation, flank and crater wear. In semi-finishing, and finishing the depth of cut is generally smaller than the nose radius and the flank wear, plastic deformation and crater wear dominate.

OBJECTS AND SUMMARY OF THE INVENTION

It is an object of the present invention to provide a cutting tool insert, particularly useful for turning in heat resistant superalloys and stainless steels under wet conditions.

It is a further object of the present invention to provide a cutting tool insert with improved notch wear resistance of the leading edge in roughing and semi-roughing and increased flank wear resistance in semi-finishing and finishing applications.

In one aspect of the invention, there is provided a cutting tool insert comprising a substrate and a coating, wherein the substrate comprises WC with a grain size of from about 0.4 to about 1.0 µm, from about 5 to about 8 wt % Co, Cr such that the Cr/ Co-ratio by weight is from about 0.05 to about 0.15, and ppm levels of Ta, Ti, or mixtures thereof, present in such amounts that the ratio Me/Co=(at-% Ti+at-% Ta)/at-% Co is lower than or equal to about 0.014−(CW_Cr)*0.008 and higher than about 0.0005, and CW_Cr is from about 0.75 to about 0.95, wherein CW_Cr=(magnetic-% Co+1.13*wt-% Cr)/wt-% Co, wherein magnetic-% Co is the weight percentage of Cr and wt-% Co is the weight percentage of Co in the cemented carbide, and the coating is a PVD $Ti_xAl_{1-x}N$-coating with an average composition of x being greater than about 0.4 but less than about 0.9 present as a single or multilayer coating with a total thickness of greater than about 1 µm, but less than about 6.0 µm.

In another aspect of the invention, there is provided a method of making a coated cutting tool insert of a cemented carbide substrate and a coating, comprising the steps of:
i) providing a substrate using conventional powder metallurgical techniques milling, pressing and sintering comprising WC with a grain size of from about 0.4 to about 1.0 µm, from about 5 to about 8 wt-% Co, Cr such that the Cr/Co-ratio by weight is from about 0.05 to about 0.15, and ppm levels of Ta, Ti or mixtures thereof, in such amounts that the ratio of Me/Co=(at-% Ti+at-% Ta)/at-% Co is lower than or equal to about 0.014−(CW_Cr)*0.008 and higher than about 0.0005, and CW_Cr is from about 0.75 to about 0.95, wherein CW_Cr=(magnetic-% Co+1.13*wt-% Cr)/wt-% Co, wherein magnetic-% Co is the weight percentage of magnetic Co, wt-% Cr is the weight percentage of Cr and wt-% Co is the weight percentage of Co in the cemented carbide, and, ii) depositing a $Ti_xAl_{1-x}N$-coating with an average composition of x being greater than about 0.4 but less than about 0.9 present as a single or multilayer coating with a total thickness of more than about 1 µm but less than about 6.0 µm, using PVD-methods.

In still another aspect of the invention, there is provided a method of turning heat resistant superalloys and stainless steels at a cutting speed of from about 30 to about 250 m/min and a feed of from about 0.1 to about 0.4 mm/rev, using a cutting tool insert comprising a substrate and a coating, wherein the substrate comprises WC with a grain size of from about 0.4 to about 1.0 µm, from about 5 to about 8 wt % Co, Cr such that the Cr/ Co-ratio by weight is from about 0.05 to about 0.15, and ppm levels of Ta, Ti or mixtures thereof, present in such amounts that the ratio Me/Co=(at-% Ti+at-% Ta)/at-% Co is lower than or equal to about 0.014−(CW_Cr)*0.008 and higher than about 0.0005, and CW_Cr is from about 0.75 to about 0.95, wherein CW_Cr=(magnetic-% Co+1.13*wt-% Cr)/wt-% Co, wherein magnetic-% Co is the weight percentage of magnetic Co, wt-% Cr is the weight percentage of Cr and wt-% Co is the weight percentage of Co in the cemented carbide, and the coating is a PVD $Ti_xAl_{1-x}N$-coating with an average composition of x being greater than about 0.4 but less than about 0.9 present as a single or multilayer coating with a total thickness of more than about 1 µm but less than about 6.0 µm.

DETAILED DESCRIPTION OF THE PREFERRED EMBODIMENTS

Figure 1:
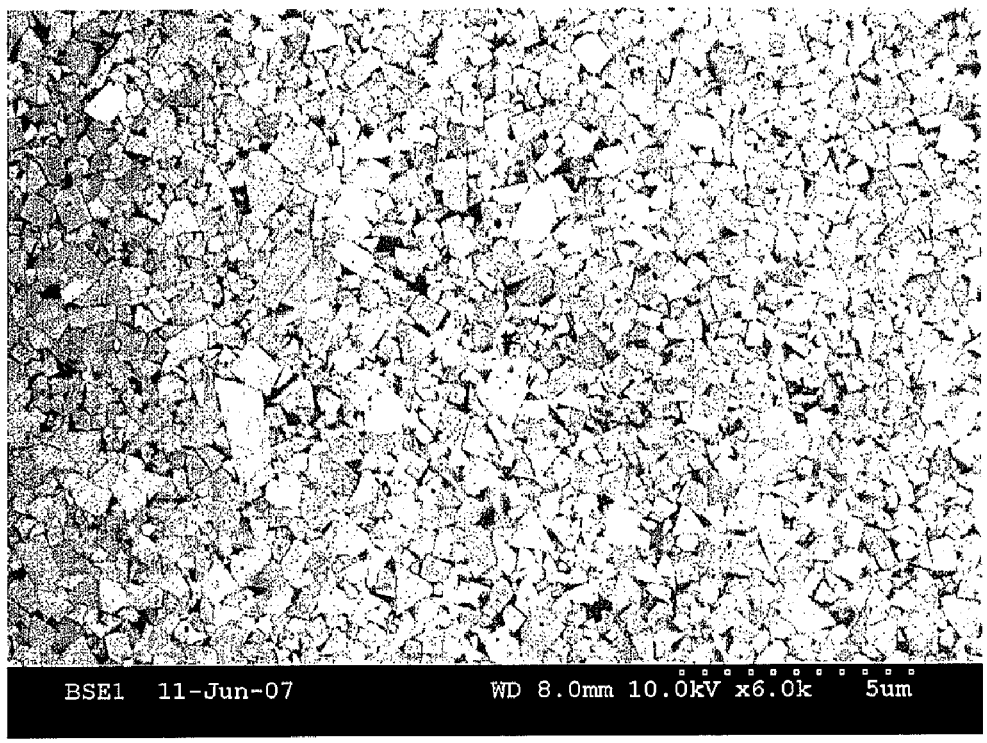
FIG. 1 shows the sintered structure of the cemented carbide according to the invention in 6000× magnification by SEM using backscattered electrons.

It has now surprisingly been found that a very fine grained and high hardness cutting tool insert coated with a PVD-coating, has greatly improved notch wear resistance on the leading edge with maintained resistance against plastic deformation and flank wear in roughing and semi-roughing operation and increased flank wear resistance in semi-finishing and finishing operation when turning heat resistant superalloys and stainless steels.

The present invention thus relates to a coated cutting tool insert of a cemented carbide body and a coating.

The cemented carbide body comprises tungsten carbide (WC) with a grain size of from about 0.4 to about 1.0 µm, preferably from about 0.5 to about 0.95 µm with from about 5 to about 8 wt-% Co, preferably from about 5.2 to about 7.8 wt-% Co, most preferably from about 5.5 to about 7.5 wt-% Co, and Cr such that the Cr/Co-ratio by weight is from about 0.05 to about 0.15, preferably from about 0.07 to about 0.14, and balance WC. Additionally, ppm levels of the elements Ti, Ta or mixtures of these, are present such that the ratio Me/Co=(at-% Ti+at-% Ta)/at-% Co is lower than, or equal to, about 0.014−(CW_Cr)*0.008, and higher than about 0.0005, preferably higher than about 0.0007, with CW_Cr being from about 0.75 to about 0.95, preferably from about 0.76 to about 0.90, wherein CW_Cr=(magnetic-% Co+1.13*wt-% Cr)/wt-% Co, wherein magnetic-% Co is the weight percentage of magnetic Co, wt-% Cr is the weight percentage of Cr and wt-% Co is the weight percentage of Co in the cemented carbide.

It has been found according to the present invention that improved cutting performance is achieved if the cemented carbide body has a CW_Cr of from about 0.75 to about 0.95, preferably from about 0.76 to about 0.90.

In one preferred embodiment, the Co-content is from about 5.7 to about 6.1 wt-%, and in another preferred embodiment from about 6.8 to about 7.2 wt-%.

The cemented carbide body is coated with a PVD $Ti_xAl_{1-x}N$-coating with an average composition of x being greater than about 0.4 but less than about 0.9. The total thickness of the coating is greater than about 1 µm, preferably greater than about 1.5 µm, most preferably greater than about 2.0 µm but less than about 6.0 µm, preferably less than about 5.0 µm, most preferably less than about 4.5 µm. Both the composition and the thickness are measured on the flank face 1 mm from the nose radius and 200 µm from the cutting edge.

In one preferred embodiment, the coating comprises a homogeneous $Al_xTi_{1-x}N$-layer with x equals from about 0.6 to about 0.67, preferably x equals about 0.62.

In another preferred embodiment, the coating comprises an aperiodic (Ti,Al)N multilayer consisting of a binary A/B/A/B/A/B structure with thin alternating sublayers A and B being repeated throughout the entire coating. One sequence of sublayers A/B is herein denoted a lamella. Due to the aperiodic nature of the coating, the thickness of each lamella will vary, but on average the lamella thickness is within from about 30 to about 300 nm, preferably from about 60 to about 120 nm. The sublayer A comprises $Al_xTi_{1-x}N$, where x equals from about 0.40 to about 0.7, preferably from about 0.5 to about 0.67. Layer B comprises of $Ti_yAl_{1-y}N$, where y equals from about 0.6 to about 1, preferably from about 0.75 to about 1. The stoichiometry for the whole coating as measured by e.g. microprobe or EDS is within the range $Ti_zAl_{1-z}N$, where z equals from about 0.40 to about 0.7, preferably from about 0.45 to about 0.6. In a preferred embodiment, there is an outer $Ti_bAl_{1-b}N$ layer, b equals from about 0.8 to about 0.9, preferably from about 0.82 to about 0.85, of sufficient thickness to give a visible, homogenous bronze-colored look, preferably from about 0.1 to about 1 µm thick.

In yet another preferred embodiment, the coating is a multilayer of a sequence of homogeneous $Ti_{0.5}Al_{0.5}N$ layers and lamella layers with alternating layers of TiN and $Ti_{0.5}Al_{0.5}N$. This sequence is repeated from about 10 to about 15 times. The thickness of the homogeneous $Ti_{0.5}Al_{0.5}N$-layers is from about 0.1 to about 0.2 µm and the thickness of the lamella layers is from about 0.1 to about 0.2 µm. The thickness of each individual TiN— or $Ti_{0.5}Al_{0.5}N$-layer in the lamella layer is from about 0.1 to about 20 nm. The average composition of the multilayer is preferably $Ti_cAl_{1-c}N$ layer, c equals from about 0.7 to about 0.9.

The present invention also relates to a method of making a coated cutting tool insert comprising a cemented carbide body and a coating. The cemented carbide body is made using conventional powder metallurgical techniques milling, pressing and sintering and comprises from about 5 to about 8 wt-% Co, preferably from about 5.2 to about 7.8 wt-% Co, most preferably from about 5.5 to about 7.5 wt-% Co and Cr such that the Cr/Co-ratio by weight is from about 0.05 to about 0.15, more preferably from about 0.07 to about 0.14, and balance WC. Additionally, ppm levels of Ti, Ta, or mixtures of these, are present such that the ratio of Me/Co=(at-% Ti+at-%Nb+at-% Ta)/at-% Co is lower than, or equal to, about 0.014−(CW_Cr)*0.008, and higher than about 0.0005, preferably higher than about 0.0007, with CW_Cr being from about 0.75 to about 0.95, preferably from about 0.76 to about 0.90, where CW_Cr=(magnetic-% Co+1.13*wt-% Cr)/wt-% Co.

The value of CW_Cr is monitored by adding suitable amounts of carbon black or tungsten powder to the powder mixture.

After conventional post sintering treatment, a PVD $Ti_xAl_{1-x}N$-coating with an average composition of x being greater than about 0.4 but less than about 0.9, is deposited by PVD-methods, preferably arc evaporation. The total thickness of the coating is greater than about 1 µm, more preferably greater than about 1.5 µm, most preferably 2.0 µm but less than about 6.0 µm, more preferably less than about 5.0 µm, most preferably less than about 4.5 µm.

The present invention also relates to the use of the insert according to above for wet turning in (heat resistant) superalloys as Inconel 718, Inconel 625, Waspaloy, Udimet 720 and stain-less steels as AISI/SAE 304, San-Mac 316L, SAF2205, SAF2507 at a cutting speed of from about 30 to about 250 m/min and a feed of from about 0.1 to about 0.4 mm/rev.

The invention is additionally illustrated in connection with the following examples, which are to be considered as illustrative of the present invention. It should be understood, however, that the invention is not limited to the specific details of the examples.

EXAMPLE 1

Tungsten carbide powder, 6 wt-% very fine grained cobalt powder, 0.6 wt-% Cr, 140 ppm Ti and 100 ppm Ta added as H. C. Starck fine grained TiC and TaC and $Cr_3C_2$-powder, were wet milled together with conventional pressing agents. After milling and spray drying, the powder was pressed into CNMG120408-QM and CNGP120408 inserts and sintered at 1410 C. After sintering the CW_Cr, Hc and HV 3 were measured. The CW_Cr was determined to 0.76 and 0.014−(CW_Cr)*0.008 to 0.00791 and Me/Co was determined to 0.00296 and the Hc was 31 kA/m and the Vickers hardness was 1983 HV 3. The average sintered WC-grain size was determined from coercivity measurements to 0.83 µm. FIG. 1 shows the sintered structure of the cemented carbide in 6000× magnification by SEM using backscattered electrons.

Figure 2:
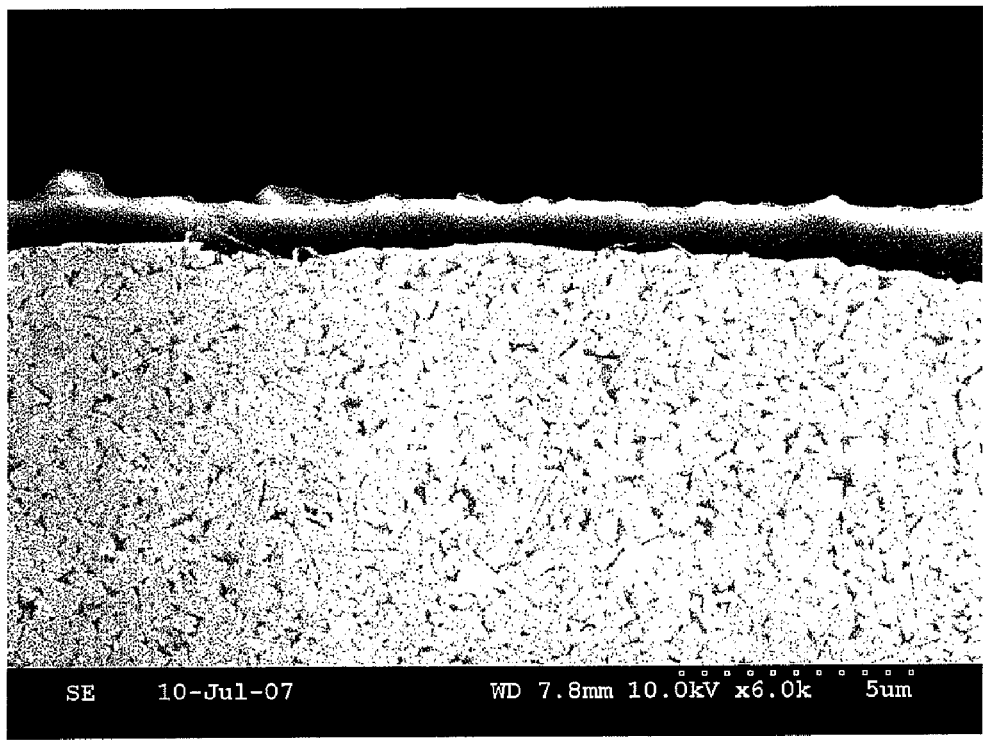
FIG. 2 shows the PVD-coated insert according to the invention in 6000× magnification by SEM using secondary electrons.

After conventional post sintering treatment, a coating was deposited using a target material consisting of $Ti_{33}Al_{67}$ alloy. The arc evaporation was performed in a $N_2$ gas atmosphere. The resulting total coating thickness was 2.0 μm, and was a homogeneous $Al_{0.62}Ti_{0.38}N$ layer. FIG. 2 shows the PVD-coated insert in 6000X magnification by SEM using secondary electrons.

Example 2

Tungsten carbide, 7 wt-% very fine grained cobalt powder, 0.7 wt-% Cr, 140 ppm Ti and 100 ppm Ta added as H.C.Starck fine grained TiC and TaC and $Cr_3C_2$-powder, were wet milled together with conventional pressing agents. After milling and spray drying the powder was pressed into CNMG120408-QM and CNGP120408 inserts and sintered at 1410 C. After sintering the CW_Cr, Hc and HV 3 were measured. The CW_Cr was determined to 0.72 and 0.014−(CW_Cr)*0.008 to 0.00737 and Me/Co was determined to 0.00258 and Hc was 29 kA/m and the Vickers hardness was 1916 HV 3. The average sintered WC-grain size was determined from coercivity measurements to 0.77 μm.

After conventional post sintering treatment, a coating was deposited using a target material of $Ti_{33}Al_{67}$ alloy. The arc evaporation was performed in a $N_2$ gas atmosphere. The resulting total coating thickness was 2.4 μm, and was a homogeneous $Al_{0.62}Ti_{0.38}N$ layer.

Example 3

A cemented carbide insert as described in Example 1 was, after conventional post sintering treatments, provided with a coating by arc evaporation performed in a $N_2$ gas atmosphere. 3.9 μm PVD (Ti,Al)N multilayer of a sequence of homogeneous $Ti_{0.5}Al_{0.5}N$ layers and lamella layers with alternating layers of TiN and $Ti_{0.5}Al_{0.5}N$. This sequence was repeated twelve times. The thickness of the homogeneous $Ti_{0.5}Al_{0.5}N$-layers was 0.1-0.2 μm and the thickness of the lamella layers was 0.1-0.2 μm. The thickness of each individual TiN or $Ti_{0.5}A_{0.5}N$-layer in the lamella layer was 0.1-20 nm. The average composition of the multilayer was $Ti_{0.8}Al_{0.2}N$ measured with SEM-EDS.

Example 4

A cemented carbide insert as described in Example 1 was after conventional post sintering treatments provided with a coating by arc evaporation performed in a $N_2$ gas atmosphere. A 3.6 μm PVD (Ti,Al)N multilayer of a binary aperiodic A/B/A/B multilayer with an average A+B thickness of 60-120 nm and a final outer color layer with composition $(Ti_{0.84}Al_{0.16})N$ was deposited. The average composition according micro-probe analysis was $(Ti_{0.50}Al_{0.50})N$.

Example 5

Figure 3:
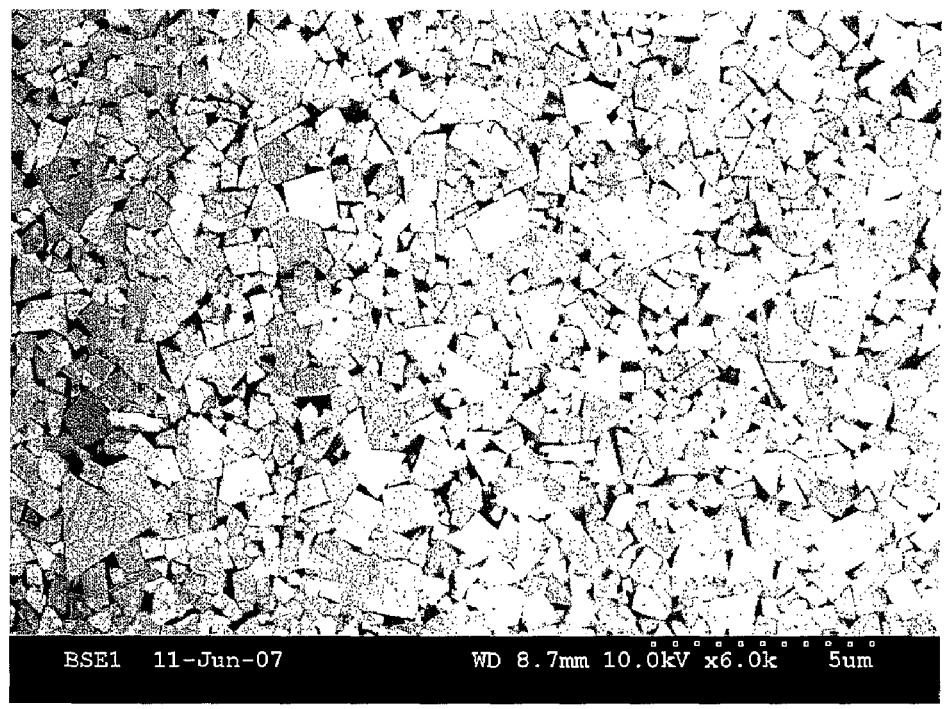
FIG. 3 shows the sintered structure of a cemented carbide according to prior art in 6000× magnification by SEM using backscattered electrons.

A prior art cemented carbide turning insert with the composition 6 wt % Co, 0.14 wt % Nb, 0.22 wt % Ta, 0.010 wt % Ti and balance WC. The CW_Cr was determined to 0.99 and 0.014−(CW_Cr)*0.008 to 0.0068 and Me/Co was determined to 0.00267. The Vickers hardness was determined to 1793 HV 3 and Hc was 21 kA/m. The sintered WC-grain size was determined from coercivity measurements to 1.3 μm and FIG. 3 shows the sintered structure of a cemented carbide according to prior art in 6000× magnification by SEM using backscattered electrons. The cemented carbide body was coated with a 2.7 μm $Al_{62}Ti_{38}N$ homogenous PVD-coating as described in Example 1 and Example 2.

Figure 4:
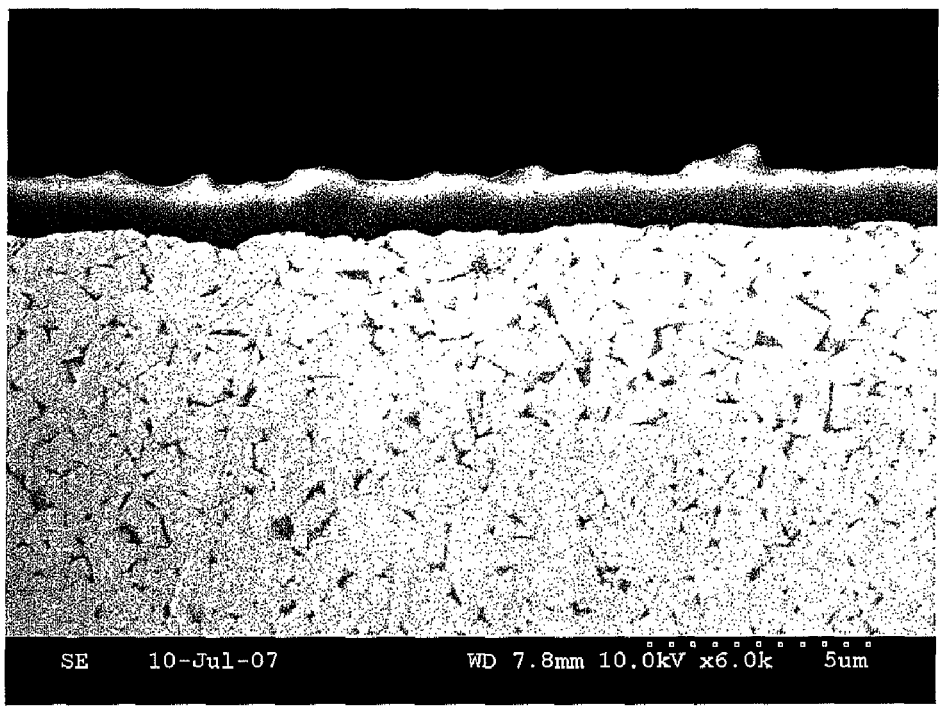
FIG. 4 shows the PVD-coated insert according to prior art in 6000× magnification by SEM using secondary electrons.

FIG. 4 shows the PVD-coated insert according to prior art in 6000× magnification by SEM using secondary electrons.

Example 6

Inserts from Example 1 and Example 5 were tested in turning of an Inconel 718 bar.

| | |
|---|---|
| Operation: | Turning-finishing |
| Work piece: | Forged and machined bar |
| Material: | Inconel 718 in forged and aged condition |
| Cutting speed: | 80 m/min |
| Feed rate: | 0.15 mm/rev |
| Depth of cut: | 0.5 mm |
| Insert-style: | CNGP120408 |
| Note: | Turning with coolant |
| Results: | Tool life, minutes of cut |
| Example 1 (invention) | 4.5 min |
| Example 5 (prior art): | 3.5 min |

Tool life criterion was flank wear 0.2 mm.

Example 7

Inserts from Example 2 and Example 5 were tested in turning of an Inconel 718 bar.

| | |
|---|---|
| Operation: | Turning-finishing |
| Work piece: | Forged and machined bar |
| Material: | Inconel 718 in forged and aged condition |
| Cutting speed: | 80 m/min |
| Feed rate: | 0.15 mm/rev |
| Depth of cut: | 0.5 mm |
| Insert-style: | CNGP120408 |
| Note: | Turning with coolant |
| Results: | Tool life, minutes of cut |
| Example 2 (invention): | 4.0 min |
| Example 5 (prior art): | 3.5 min |

Tool life criterion was flank wear 0.2 mm.

Example 8

Inserts from Example 1, Example 3, Example 4 and Example 5 were tested in turning of an Inconel 718 bar.

| | |
|---|---|
| Operation: | Turning-semi roughing |
| Work piece: | Forged and machined bar |
| Material: | Inconel 718 in forged and aged condition |
| Cutting speed: | 60 m/min |
| Feed rate: | 0.2 mm/rev |
| Depth of cut: | 1.5 mm |
| Insert-style: | CNMG120408-QM |
| Note: | Turning with coolant |
| Results: | Tool life, minutes of cut |
| Example 1 (invention): | 8.0 min |
| Example 3 (invention): | 4.0 min |
| Example 4 (invention): | 5.5 min |
| Example 5 (prior art): | 3.0 min |

Tool life criterion was notch wear on main cutting edge 0.3 mm.

Example 9

Inserts from Example 2 and Example 5 were tested in turning of an Inconel 718 bar.

| | |
|---|---|
| Operation: | Turning-semi roughing |
| Work piece: | Forged and machined bar |
| Material: | Inconel 718 in forged and aged condition |
| Cutting speed: | 60 m/min |
| Feed rate: | 0.2 mm/rev |
| Depth of cut: | 1.5 mm |
| Insert-style: | CNMG120408-QM |
| Note: | Turning with coolant |
| Results: | Tool life, minutes of cut |
| Example 2 (invention): | 7.5 min |
| Example 5 (prior art): | 3.0 min |

Tool life criterion was notch wear on main cutting edge 0.3 mm.

Example 10

Inserts from Example 1, Example 2 and Example 5 were tested in turning of an Inconel 718 bar.

| | |
|---|---|
| Operation: | Turning-semi roughing |
| Work piece: | Forged and machined bar |
| Material: | Inconel 718 in forged and aged condition |
| Cutting speed: | 60 m/min |
| Feed rate: | 0.2 mm/rev |
| Depth of cut: | 1.5 mm |
| Insert-style: | CNMG120408-QM |
| Note: | Turning with coolant |
| Results: | Notch wear on main cutting edge after 3 minutes in cut. |
| Example 1 (invention): | 0.02 mm |
| Example 2 (invention): | 0.09 mm |
| Example 5 (prior art): | 0.40 mm |

Tool change after 3 minutes of machining.

Example 11

Inserts from Example 1 and Example 5 were tested in turning of a SAF2205 bar.

| | |
|---|---|
| Operation: | Turning - semi roughing |
| Work piece: | Machined bar |
| Material: | SAF2205 |
| Cutting speed: | 170 m/min |
| Feed rate: | 0.33 mm/rev |
| Depth of cut: | 2.0 mm |
| Insert-style: | CNMG120408-QM |
| Note: | Turning with coolant |
| Results: | Notch wear after 10 min in cut. |
| Example 1 (invention): | 0.09 mm |
| Example 5 (prior art): | 0.24 mm |

Example 12

Inserts from Example 1 and Example 5 were tested in turning of a SAF2507 bar.

| | |
|---|---|
| Operation: | Turning-roughing |
| Work piece: | Machined bar |
| Material: | SAF2507 |
| Cutting speed: | 130 m/min |
| Feed rate: | 0.23 mm/rev |
| Depth of cut: | 2.0 mm |
| Insert-style: | CNMG120408-QM |
| Note: | Turning with coolant |
| Results: | Notch wear on main cutting edge after 12 minutes in cut. |
| Example 1 (invention): | 0.04 mm |
| Example 5 (prior art): | 0.18 mm |

Example 13

Inserts from Example 2 and Example 5 were tested in turning of an AISI/SAE 304 bar.

| | |
|---|---|
| Operation: | Turning |
| Work piece: | Machined bar |
| Material: | AISI/SAE 304 |
| Cutting speed: | 200 m/min |
| Feed rate: | 0.35 mm/rev |
| Depth of cut: | 1.2 mm |
| Insert-style: | CNMG120408-QM |
| Note: | Turning with coolant |
| Results: | Tool life, minutes of cut |
| Example 2 (invention): | 12.0 min |
| Example 5 (prior art): | 8.5 min |

Tool life criterion was notch wear on main cutting edge 0.3 mm.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. Cutting tool insert comprising a substrate and a coating, wherein the substrate comprises WC with a grain size of from about 0.4 to about 1.0 μm, from about 5 to about 8 wt % Co, Cr such that a Cr/Co-ratio by weight is from about 0.05 to about 0.15, and ppm levels of Ta, Ti, or mixtures thereof, present in such amounts that a ratio Me/Co=(at-% Ti+at-% Ta)/at-% Co is lower than or equal to about 0.014−(CW_Cr)*0.008 and higher than about 0.0005, and CW_Cr is from about 0.75 to about 0.95, wherein CW_Cr=(magnetic-% Co+1.13*wt-% Cr)/wt-% Co, wherein magnetic-% Co is the weight percentage of magnetic Co, wt-% Cr is the weight percentage of Cr and wt-% Co is the weight percentage of Co in the cemented carbide, and the coating is a PVD $Ti_xAl_{1-x}N$-coating, with an average composition of x being greater than about 0.4 but less than about 0.9, present as a single or multilayer coating with a total thickness of greater than about 1 μm, but less than about 6.0 μm.

2. Cutting tool insert according to claim 1, wherein the ratio of Me/Co=(at-% Ti+at-% Ta)/at-% Co is higher than about 0.0007.

3. Cutting tool insert according to claim 1, wherein CW_Cr is from about 0.76 to about 0.90.

4. Cutting tool insert according to claim 1, wherein the single or multilayer coating has a total thickness of greater than about 2 μm but less than about 4.5 μm.

5. Cutting tool insert according to claim 1, wherein the coating comprises a homogeneous $Al_xTi_{1-x}N$-layer with x equals from about 0.6 to about 0.67.

6. Cutting tool insert according to claim 5, wherein x equals about 0.62.

7. Cutting tool insert according to claim 1, wherein the coating comprises an aperiodic (Ti,Al)N multilayer of a binary A/B/A/B/A/B structure with thin alternating sublayers A and B being repeated throughout the entire coating with a lamella A/B thickness of from about 30 to about 300 nm, wherein the sublayer A comprises $Al_xTi_{1-x}N$, where x is from about 0.40 to about 0.7, and sublayer B comprises of $Ti_yAl_{1-y}N$, where y is from about 0.6 to about 1, with a total composition within the interval $Ti_zAl_{1-z}N$, z: from about 0.40 to about 0.7.

8. Cutting tool insert according to claim 7, wherein the lamella A/B thickness is from about 60 to about 120 nm.

9. Cutting tool insert according to claim 7, wherein x equals from about 0.5 to about 0.67.

10. Cutting tool insert according to claim 7, wherein y equals from about 0.75 to about 1.

11. Cutting tool insert according to claim 7, wherein z equals from about 0.45 to about 0.6.

12. Cutting tool insert according to claim 7, wherein an outer $Ti_bAl_{1-b}N$ layer, b equals from about 0.8 to about 0.9, is present, of sufficient thickness to give a visible, homogenous bronze-colored look.

13. Cutting tool insert according to claim 12, wherein b equals from about 0.82 to about 0.85.

14. Cutting tool insert according to claim 1, wherein the coating is a multilayer of a sequence of homogeneous $Ti_{0.5}Al_{0.5}N$ layers and lamella layers with alternating layers of TiN and $Ti_{0.5}Al_{0.5}N$ repeated from about 10 to about 15 times with a thickness of the homogeneous $Ti_{0.5}Al_{0.5}N$-layers of from about 0.1 to about 0.2 μm, a thickness of the lamella layers of from about 0.1 to about 0.2 μm and a thickness of each individual TiN— or $Ti_{0.5}Al_{0.5}N$-layer in the lamella layer of from about 0.1 to about 20 nm with an average composition of the multilayer of preferably $Ti_cAl_{1-c}N$ with c equals from about 0.7 to about 0.9.

15. Cutting tool insert according to claim 1, wherein the substrate comprises from about 5.5 to about 7.5 wt-% Co.

16. Cutting tool insert according to claim 1, wherein the substrate comprises from about 5.7 to about 6.1 wt-% Co.

17. Cutting tool insert according to claim 1, wherein the substrate comprises from about 6.8 to about 7.2 wt-% Co.

18. Method of making a coated cutting tool insert of a cemented carbide substrate and a coating, comprising the steps of:

i) providing a substrate using conventional powder metallurgical techniques milling, pressing and sintering comprising WC with a grain size of from about 0.4 to about 1.0 μm, from about 5 to about 8 wt-% Co, Cr such that the Cr/Co-ratio by weight is from about 0.05 to about 0.15, and ppm levels of Ta, Ti or mixtures thereof, in such amounts that a ratio of Me/Co=(at-% Ti+at-% Ta)/at-% Co is lower than or equal to about 0.014−(CW_Cr)*0.008 and higher than about 0.0005, and CW_Cr is from about 0.75 to about 0.95, wherein CW_Cr=(magnetic-% Co+1.13*wt-% Cr)/wt-% Co, wherein magnetic-% Co is the weight percentage of magnetic Co, wt-% Cr is the weight percentage of Cr and wt-% Co is the weight percentage of Co in the cemented carbide, and, ii) depositing a $Ti_xAl_{1-x}N$-coating with an average composition of x being greater than about 0.4 but less than about 0.9, present as a single or multilayer coating with a total thickness of more than about 1 μm but less than about 6.0 μm, using PVD-methods.

19. Method according to claim 18, wherein the substrate comprises from about 5.5 to about 7.5 wt-% Co.

20. Method according to claim 18, wherein the ratio Me/Co=(at-% Ti+at-% Ta)/at-% Co is higher than about 0.0007.

21. Method according to claim 18, wherein CW_Cr is from about 0.76 to about 0.90.

22. Method according to claim 18, wherein the total thickness of the single- or multilayer coating is more than about 2.0 μm but less than about 4.5 μm.

23. Method according to claim 18, wherein the PVD-method is arc evaporation.

24. Method of turning heat resistant superalloys and stainless steels at a cutting speed of from about 30 to about 250 m/min and a feed of from about 0.1 to about 0.4 mm/rev, using a cutting tool insert comprising a substrate and a coating, wherein the substrate comprises WC with a grain size of from about 0.4 to about 1.0 μm, from about 5 to about 8 wt % Co, Cr such that the Cr/Co-ratio by weight is from about 0.05 to about 0.15, and ppm levels of Ta, Ti or mixtures thereof, present in such amounts that a ratio Me/Co=(at-% Ti+at-% Ta)/at-% Co is lower than or equal to about 0.014−(CW_Cr)*0.008 and higher than about 0.0005, and CW_Cr is from about 0.75 to about 0.95, wherein CW_Cr=(magnetic-% Co+1.13*wt-% Cr)/wt-% Co, wherein magnetic-% Co is the weight percentage of magnetic Co, wt-% Cr is the weight percentage of Cr and wt-% Co is the weight percentage of Co in the cemented carbide, and the coating is a PVD $Ti_xAl_{1-x}N$-coating with an average composition of x being greater than about 0.4 but less than about 0.9, present as a single or multilayer coating with a total thickness of more than about 1 μm but less than about 6.0 μm.

* * * * *